United States Patent [19]
Yoneda et al.

[11] Patent Number: 4,887,137
[45] Date of Patent: Dec. 12, 1989

[54] SEMICONDUCTOR MEMORY DEVICE

[75] Inventors: Masahiro Yoneda; Masahiro Hatanaka; Yoshio Kohno; Shinichi Satoh; Hidekazu Oda; Koichi Moriizumi, all of Hyogo, Japan

[73] Assignee: Mitsubishi Denki Kabushiki Kaisha, Tokyo, Japan

[21] Appl. No.: 170,028

[22] Filed: Mar. 4, 1988

[30] Foreign Application Priority Data

Jul. 2, 1987 [JP] Japan ................. 62-167165

[51] Int. Cl.⁴ .................................. H01L 29/78
[52] U.S. Cl. ..................... 357/23.6; 357/41; 357/24; 365/53; 365/149
[58] Field of Search ............ 357/23.6, 41, 24; 365/104, 53, 149

[56] References Cited

U.S. PATENT DOCUMENTS

| | | | |
|---|---|---|---|
| 4,287,571 | 9/1981 | Chakravarti et al. | 365/104 |
| 4,541,006 | 1/1984 | Ariizumi et al. | 357/41 |
| 4,651,183 | 3/1987 | Lange | 357/23.6 |
| 4,654,825 | 3/1987 | Rinerson | 365/185 |
| 4,737,837 | 4/1988 | Lee | 357/46 |
| 4,763,178 | 8/1988 | Sakui et al. | 357/23.6 |

FOREIGN PATENT DOCUMENTS

| | | |
|---|---|---|
| 0183517 | 6/1986 | European Pat. Off. |
| 2619849 | 3/1980 | Fed. Rep. of Germany |
| 3521059 | 12/1986 | Fed. Rep. of Germany |
| 5541754 | 9/1978 | Japan |
| 0041754 | 3/1980 | Japan |

Primary Examiner—William D. Larkins
Assistant Examiner—David Soltz
Attorney, Agent, or Firm—Lowe, Price, LeBlanc, Becker & Shur

[57] ABSTRACT

A semiconductor memory device comprises four memory cells (4a, 6) arranged in point symmetry on a semiconductor substrate (1), and an insulating layer (10) covering the memory cells and having one contact hole (2) placed in the center of the point symmetry, with the contact hole enabling electrical connection to each of the memory cells.

8 Claims, 6 Drawing Sheets

SEMICONDUCTOR MEMORY DEVICE

BACKGROUND OF THE INVENTION

1. Field of the Invention

The present invention relates to a semiconductor memory device and, more specifically, it relates to an improvement in the arrangement of the memory cells and in the electrical connection structure.

2. Description of the Prior Art

A semiconductor memory device comprises capacitors in which information is stored, transistors which are switched by corresponding word lines for inputting (writing) and outputting (reading) information to and from the corresponding capacitors, and bit lines connected to the transistors for transmitting the information.

FIG. 1 shows a schematic plan view of a conventional dynamic memory device. FIG. 2 is a schematic cross sectional view taken along a line D—D in FIG. 1. In these figures, a source region 6a and drain regions 6b of transistors 6 are formed on a main surface of a silicon substrate 1 and capacitor regions 4a are provided adjacent to the drain region 6b. These regions are surrounded by an isolation region 7 and a channel cut 8 is formed below the isolation region 7. On channel regions 3a provided between the source region 6a and the drain regions 6b, word lines 3 are formed with corresponding gate insulating films 3b interposed therebetween. A capacitor electrode 9 is formed over the capacitor regions 4a with a capacitor insulating film 4b interposed therebetween. The area on which the capacitor electrode 9 is formed is shown by the hatching of broken lines in FIG. 1. These word lines 3 and the capacitor electrode 9 are covered with an insulating layer 10. A bit line 5 formed on the insulating layer 10 is connected through a contact hole 2 to the source region 6a which is common to the two transistors 6. Namely, the two capacitor regions 4a are connected to the one bit line 5 through the respective switching transistors 6 and the one contact hole 2.

As described above, in a conventional dynamic memory device, two memory cells are connected to one bit line through one contact hole, so that contact holes are required by half the number of the memory cells. Therefore, the area occupied by the many contact holes make it difficult to produce a highly integrated semiconductor memory device.

SUMMARY OF THE INVENTION

In view of the above described prior art, an object of the present invention is to provide a semiconductor memory device which is highly integrated by decreasing the number of the contact holes.

A semiconductor memory device in accordance with the present invention comprises a semiconductor substrate, four memory cells arranged in point symmetry on the substrate and an insulating layer covering these memory cells and having one contact hole placed in the center of the point symmetry, with the contact hole enabling electrical contact to each of the memory cells.

In a semiconductor memory device, therefore, reading and writing from and into four memory cells can be carried out through one contact hole and two bit lines, so that a semiconductor memory device can be provided which is highly integrated due to the decrease of the number of the contact holes.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
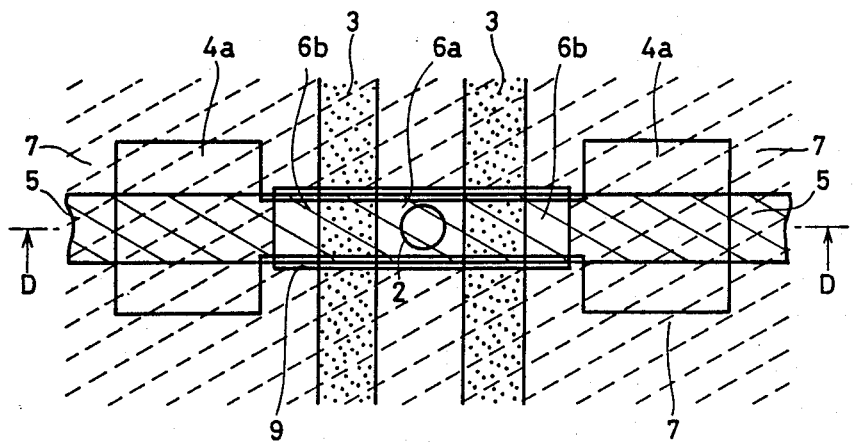
FIG. 1 is a schematic plan view of a conventional semiconductor memory device.
Figure 2:
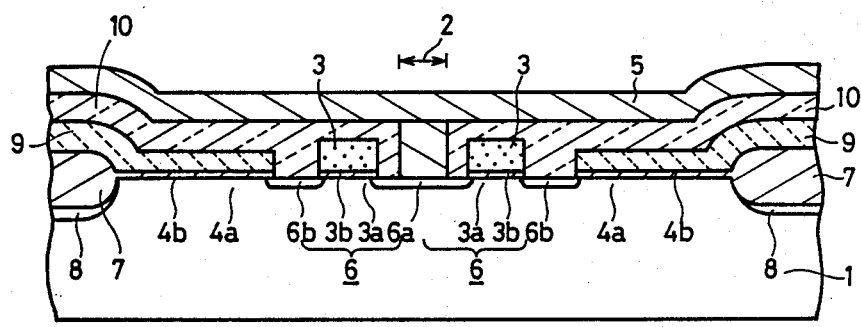
FIG. 2 is a schematic cross sectional view taken along a line D—D of FIG. 1.
Figure 3:
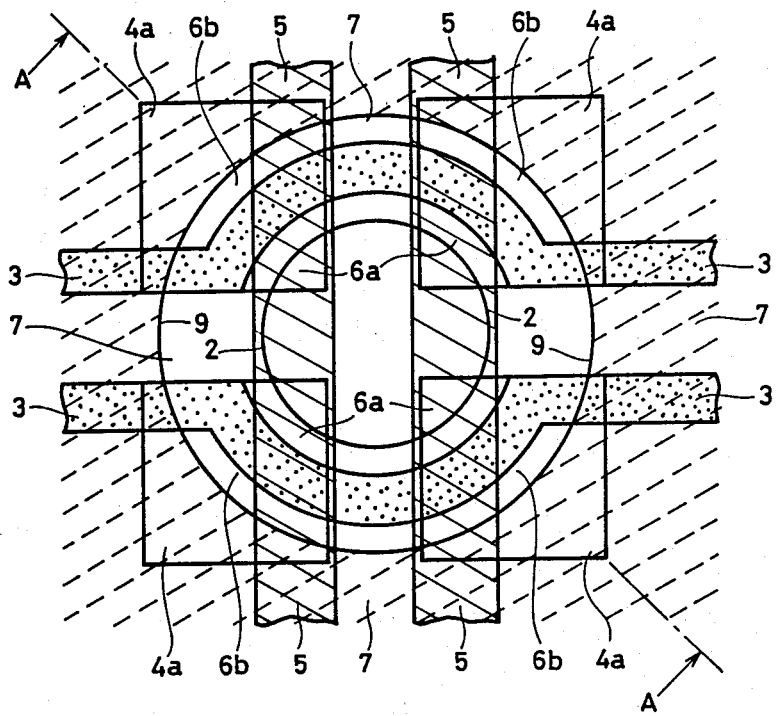
FIG. 3 is a schematic plan view of a semiconductor memory device in accordance with one embodiment of the present invention.
Figure 4:
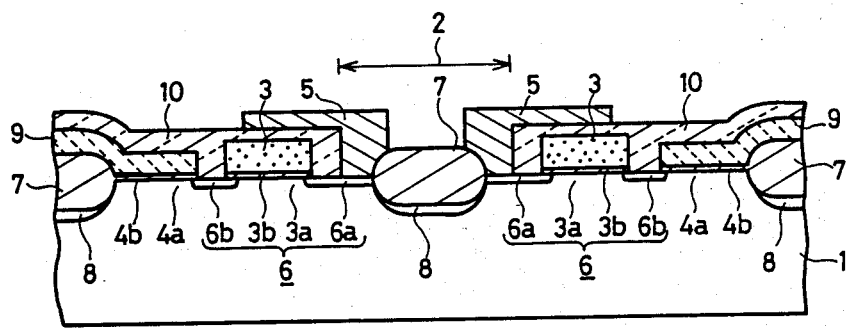
FIG. 4 is a schematic cross sectional view taken along a line A—A of FIG. 1.

FIG. 3 shows a schematic plan view of a dynamic semiconductor memory device in accordance with one embodiment of the present invention. FIG. 4 is a schematic cross sectional view taken along a line A—A of FIG. 3. In these figures, source regions 6a and drain regions 6b of transistors are formed on a main surface of a semiconductor substrate 1 and, in addition, capacitor regions 4a are provided adjacent to the corresponding drain regions 6b. Each memory cell region is surrounded by an isolating region 7 of an oxide film which is formed by selective oxidation or the like, with a channel cut 8 formed below the isolating region 7. On channel regions 3a provided between the source regions 6a and the drain regions 6b, word lines 3 are formed with gate insulating films 3b interposed therebetween. A capacitor electrode 9 is formed over the capacitor regions 4a with a capacitor insulating film 4b interposed therebetween. The area on which the capacitor electrode 9 is formed is shown by the hatching of broken lines in FIG. 3. The word lines 3 and capacitor electrode 9 are covered with an insulating layer 10. Bit liens 5 formed on the insulating layer 10 are connected to the source regions 6a through a contact hole 2.

As in apparent from FIG. 3, four transistors 6 arranged in point symmetry about the contact hole 2 are isolated from each other by the isolating region 7. One bit line 5 is connected to the source regions 6a of two transistors through the contact hole 2 while another bit line is connected to the source regions 6a of the other two transistors through the same contact hole. More specifically, only one contact hole is needed for four memory cells, whereby high integration of the semiconductor memory device is made possible due to the decrease of the number of the contact holes.

Figure 6:
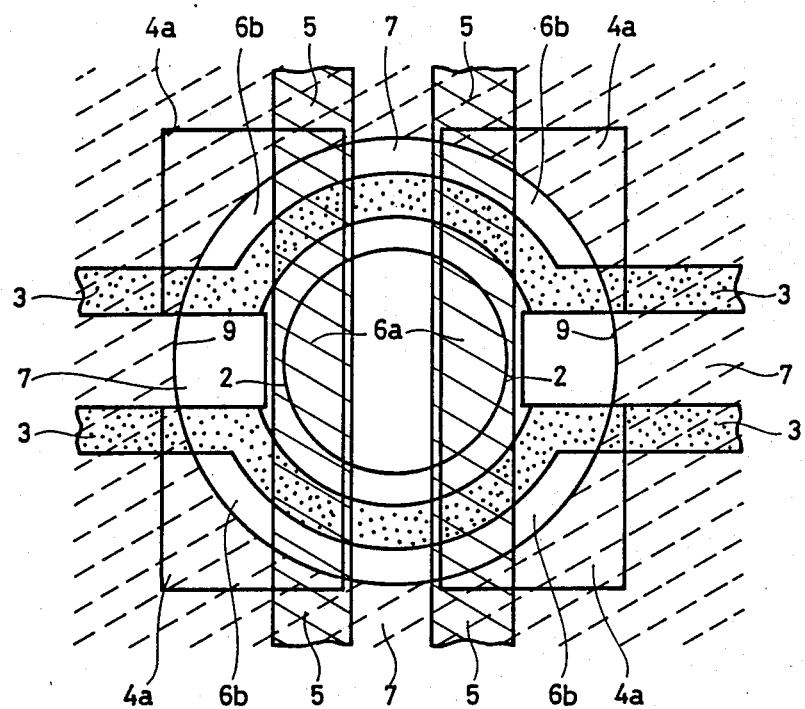
FIG. 6 is a cross sectional view similar to FIG. 3, but showing a further embodiment.

FIG. 6 is a plan view similar to FIG. 3, but showing another embodiment with some portions modified. In this embodiment, source regions 6a of two transistors connected to the same bit line 5 are not isolated from each other by an isolating region and thus are formed as one common source region.

Figure 5:
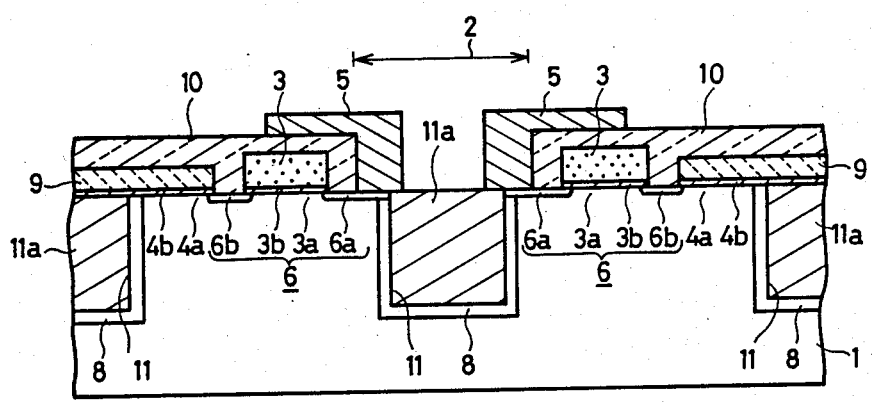
FIG. 5 is a cross sectional view similar to that of FIG. 4, but showing another embodiment.

FIG. 5 is a cross sectional view similar to FIG. 4, but showing a further embodiment with some portions modified. In this embodiment, an isolating trench 11 is provided instead of the oxide film 7 for isolation. A channel cut 8 is provided on the side wall and the bottom surface of the isolating trench 11. The isolating trench 11 may be filled with an insulating material 11a.

Figure 7:
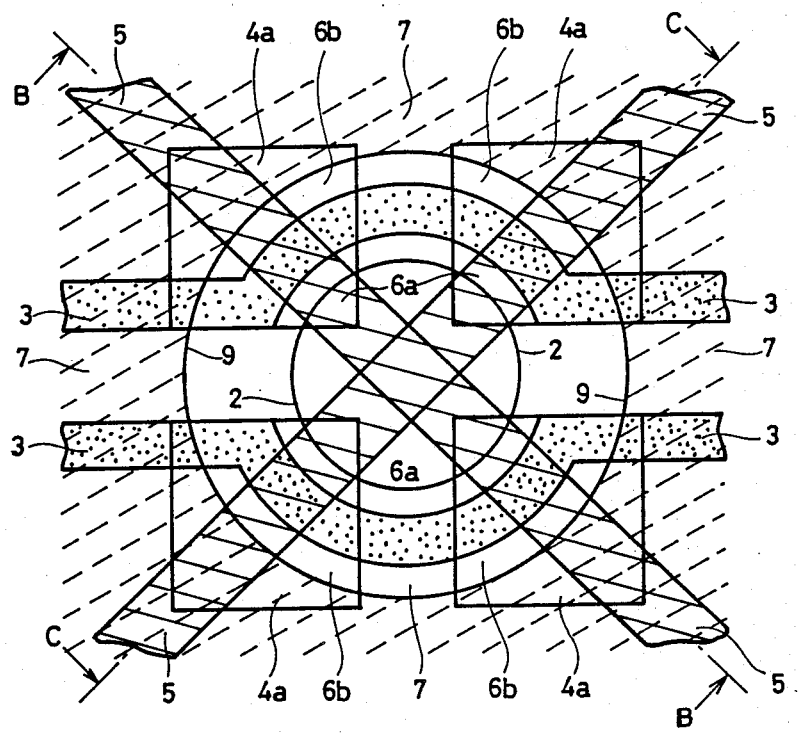
FIG. 7 is a schematic plan view of a semiconductor memory device in accordance with a still further embodiment.
Figure 8:
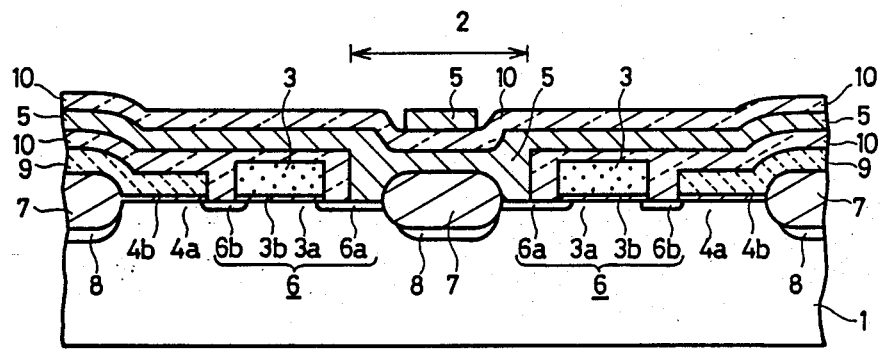
FIG. 8 is a schematic cross sectional view taken along a lone B—B of FIG. 7.
Figure 9:
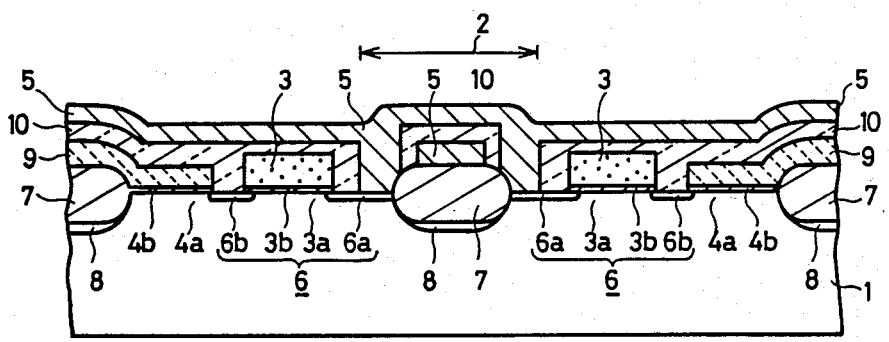
FIG. 9 is a schematic cross sectional view taken along a line C—C of FIG. 5.

FIG. 7 is a plan view similar to FIG. 3, but showing a still further embodiment. In this embodiment, reading and writing is carried out through one bit line 5 from and to the two memory cells which are in the relation of point symmetry about the contact hole 2. FIGS. 8 and 9 are cross sectional views taken along a line B—B and a line C—C of FIG. 7, respectively. As is apparent from these cross sectional views, two bit lines 5 are solid crossed for multilayer connection in the contact hole region, with each of the bit lines 5 being connected to the source regions of the transistors in the two memory cells which are in point symmetry.

As described above, according to the present invention, reading and writing from and into four memory cells can be carried out through one contact hole and two bit lines. Therefore, only one contact hole is necessary for four memory cells, whereby a semiconductor memory device can be provided which is highly integrated due to the decrease of the number of the contact holes.

Although the present invention has been described and illustrated in detail, it is clearly understood that the same is by way of limitation and example only and is not to be taken by way of limitation, the spirit and scope of the present invention being limited only by the terms of the appended claims.

What is claimed is:

1. A semiconductor memory device comprising a semiconductor substrate (1),
   four memory cells (4a) arranged in point symmetry on said substrate, and
   insulating layer (10) covering said memory cells and having one contact hole (2) placed in the center of the point symmetry, wherein said contact hole enables electrical connection to each of said memory cells, and wherein said contact hole (2) comprises a plurality of contact regions (6a) isolated from each other, said device further comprising one bit line (5) connected to two memory cells through said contact region(s) and another bit line (5) connected to the remaining two memory cells.

2. A semiconductor memory device according to claim 1, wherein said plurality of contact regions (6a) are separated from each other by an oxide film(7).

3. A semiconductor memory device according to claim 1, wherein said plurality of contact regions (6a) are isolated from each other by a trench (11).

4. A semiconductor memory device according to claim 3, wherein said trench (11) is filled with insulating material (11a).

5. A semiconductor memory device according to claim 1, wherein said two bit lines (5) are formed opposite to each other in parallel.

6. A semiconductor memory device according to claim 1, wherein said two bit lines (5) are formed in solid crossing in said contact hole region (2).

7. A semiconductor memory device according to claim 1, wherein each of said memory cells comprises one capacitor (4a) and one transistor (6), and wherein said bit line (5) is connected to said transistor.

8. A semiconductor memory device according to claim 7, wherein said transistor (6) is a field effect transistor.

* * * * *